United States Patent
Nongaillard et al.

(10) Patent No.: US 12,554,190 B2
(45) Date of Patent: Feb. 17, 2026

(54) METHOD FOR MANUFACTURING A SET OF ELECTRONIC COMPONENTS ON THE FRONT OF A SEMICONDUCTOR SUBSTRATE

(71) Applicant: STMicroelectronics France, Montrouge (FR)

(72) Inventors: Matthieu Nongaillard, Grenoble (FR); Thomas Oheix, Grenoble (FR)

(73) Assignee: STMicroelectronics France, Montrouge (FR)

( * ) Notice: Subject to any disclaimer, the term of this patent is extended or adjusted under 35 U.S.C. 154(b) by 248 days.

(21) Appl. No.: 18/247,872

(22) PCT Filed: Oct. 18, 2021

(86) PCT No.: PCT/FR2021/051807
§ 371 (c)(1),
(2) Date: Apr. 4, 2023

(87) PCT Pub. No.: WO2022/079400
PCT Pub. Date: Apr. 21, 2022

(65) Prior Publication Data
US 2023/0408902 A1 Dec. 21, 2023

(30) Foreign Application Priority Data
Oct. 16, 2020 (FR) ........................... 2010601

(51) Int. Cl.
*G03F 7/20* (2006.01)
*G03F 1/38* (2012.01)
(Continued)

(52) U.S. Cl.
CPC ............ *G03F 1/38* (2013.01); *G03F 7/70683* (2013.01); *H01L 23/544* (2013.01); *H01L 2223/54426* (2013.01)

(58) Field of Classification Search
CPC ..... G03F 1/38; G03F 7/70683; H01L 23/544; H01L 2223/54426
See application file for complete search history.

(56) References Cited

U.S. PATENT DOCUMENTS 8,187,897 B2 5/2012 Cohn et al.
2007/0148599 A1 6/2007 True
(Continued)

FOREIGN PATENT DOCUMENTS

JP H0378224 A 4/1991

*Primary Examiner* — Mesfin T Asfaw
(74) *Attorney, Agent, or Firm* — Seed Intellectual Property Law Group LLP

(57) ABSTRACT

The invention concerns a method of manufacturing an assembly of electronic components on a front surface of a semiconductor substrate comprising a plurality of field areas, each field area comprising at least one field and each field comprising at least one electronic component, the method comprising a plurality of photolithography steps to form a stack of layers forming each electronic component, each photolithography step defining a mask level and comprising the application of a mask successively on each field in photolithography equipment, the positioning of said mask on each field being performed relative to a reference mask level, one of the masks being designated as identification mask.
The manufacturing method is remarkable in that:
 at the photolithography step defining a mask level associated with the identification mask, said mask is positioned with a predetermined offset with respect to the reference mask level, the offset being different for each field area,
 the electronic component(s) of a field area have an identification element appearing as a predetermined
(Continued)

offset between a pattern defined at the reference mask level and a pattern defined at the identification mask level.

21 Claims, 3 Drawing Sheets

(51) Int. Cl.
*G03F 7/00* (2006.01)
*H01L 23/544* (2006.01)

(56) References Cited

U.S. PATENT DOCUMENTS

2009/0315193 A1 12/2009 Ortner
2013/0299939 A1 11/2013 Amoah et al.
2019/0214348 A1* 7/2019 Liu .......................... H01L 22/20

* cited by examiner

[Fig. 1]
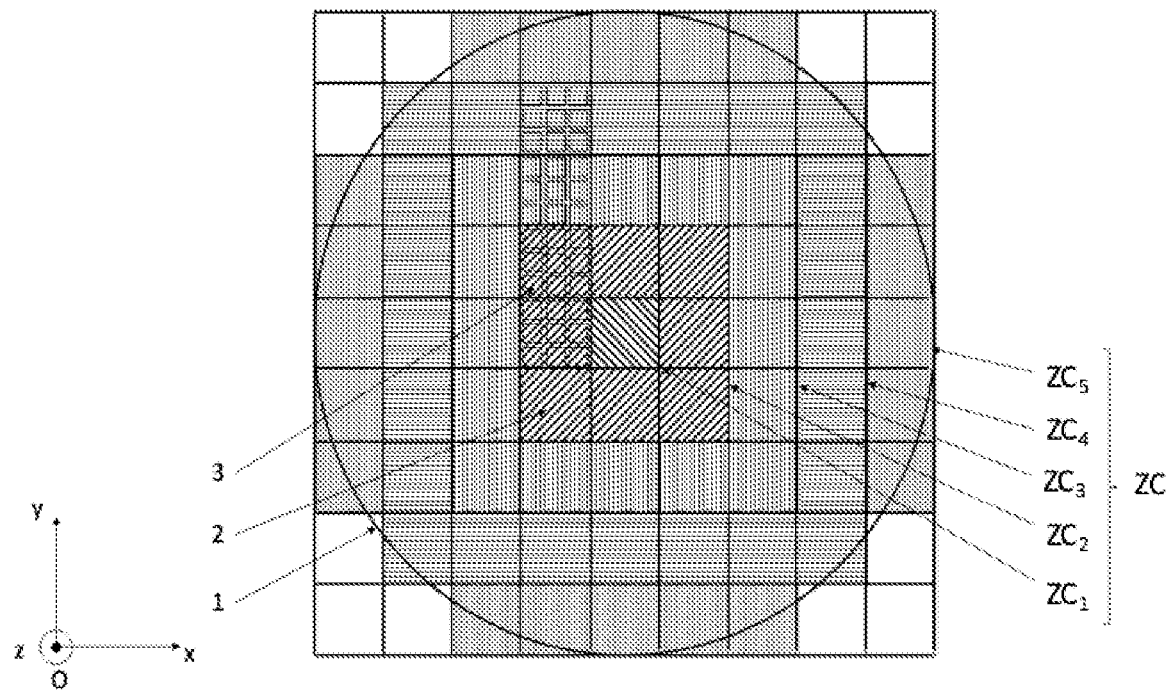
[Fig. 2a]
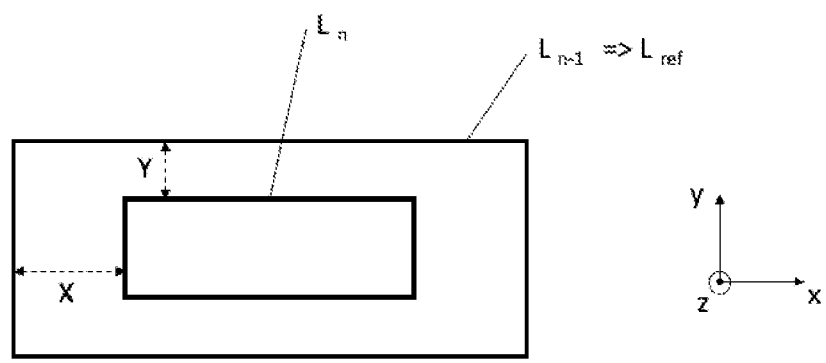

[Fig. 2b]
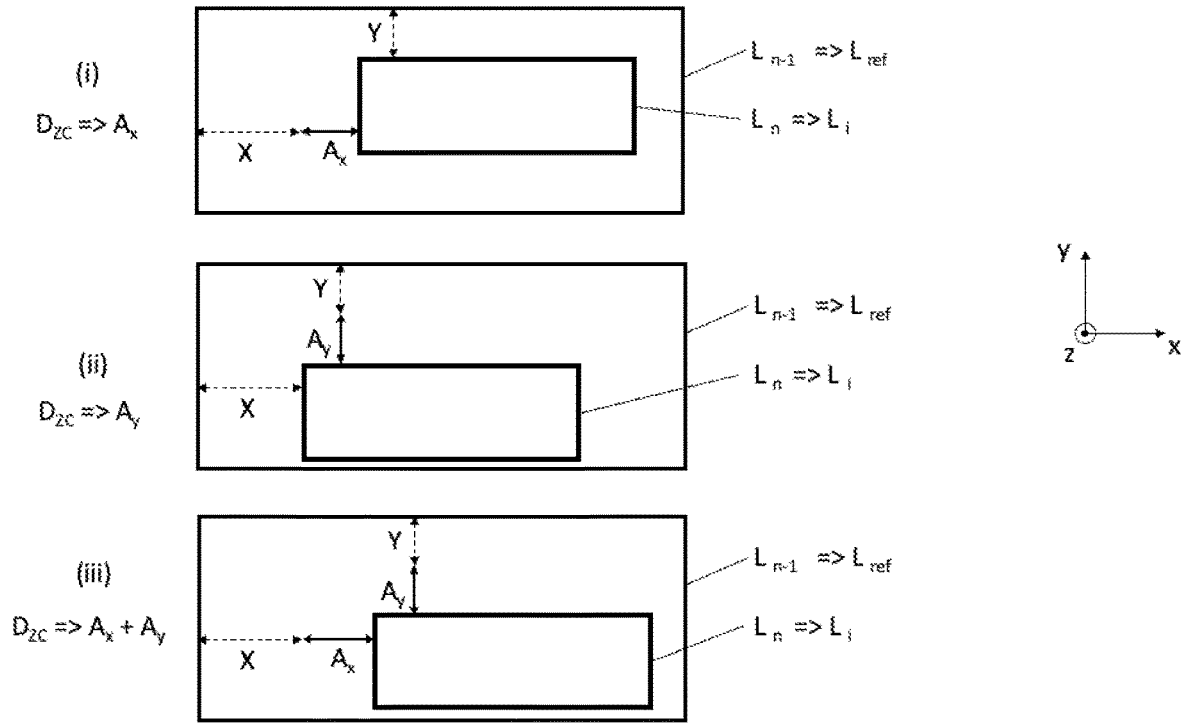
[Fig. 2c]
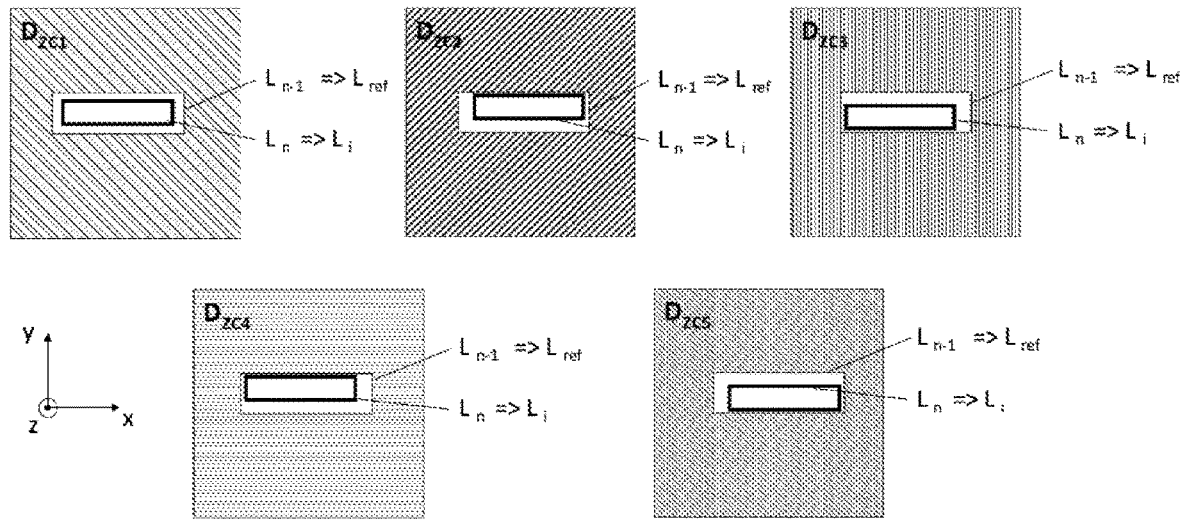

[Fig. 3a]
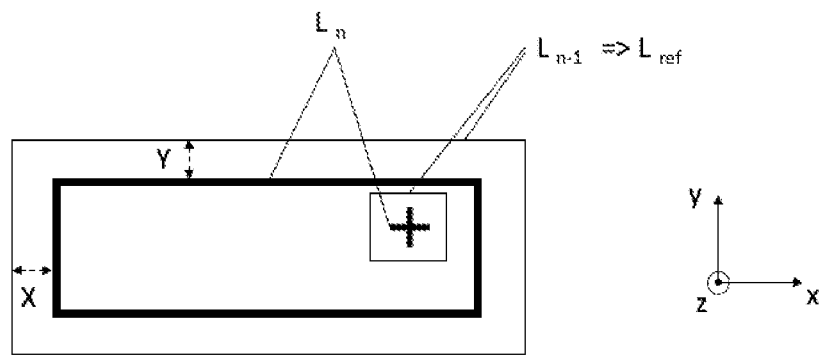
[Fig. 3b]
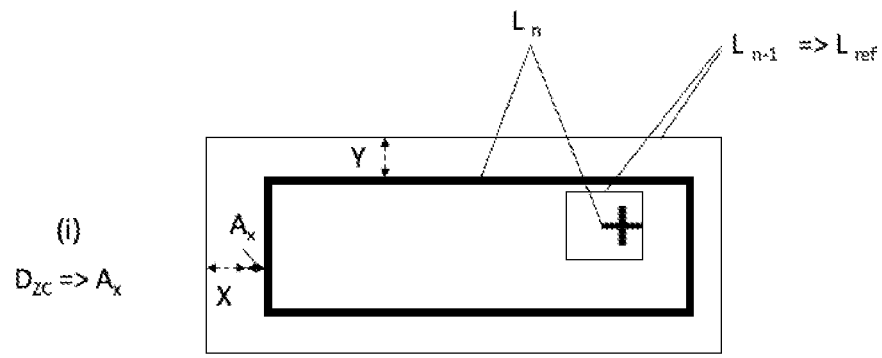
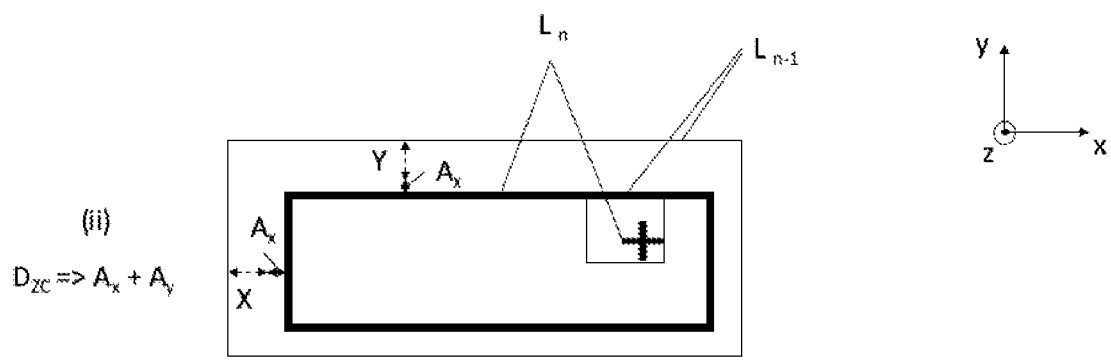

METHOD FOR MANUFACTURING A SET OF ELECTRONIC COMPONENTS ON THE FRONT OF A SEMICONDUCTOR SUBSTRATE

FIELD OF THE INVENTION

The present invention concerns the field of semiconductors. More precisely, the present invention relates to a method of manufacturing an assembly of electronic components on a semiconductor substrate, enabling, after singulation of the components, to trace back the location of these components on the substrate, due to the presence on each component of an identification element.

TECHNOLOGICAL BACKGROUND OF THE INVENTION

In the semiconductor industry, it is usual to collectively manufacture an assembly of identical electronic components on a semiconductor substrate. To form the stacks of layers forming the electronic components on the substrate, photolithography steps are particularly used, which enable to structure certain layers of said stack. In practice, a layer of material is deposited over the entire substrate, after which resist is deposited on the layer. A photolithography mask is then applied above the layer, successively on each exposure field, and the entire portion non-covered with the mask is exposed to light, locally transforming the resist. The transformed resist is then removed, and the layer is locally etched according to the pattern of the mask, over the entire surface of the semiconductor substrate, before the remaining resist is removed in turn. Steps of cleaning, polishing, and/or thermal treatments may also be carried out between these steps. The process is thus repeated for a plurality of layers in the stack, using each time a different photolithography mask.

When the all the electronic components are formed on the substrate, the latter is cut around each component, to form a chip which is then individually encapsulated in a package. Usually, the chip pick-and-place equipment computationally ensures the mapping between each chip (component) and the semiconductor wafer from which it originates.

However, in case of a failure of a component, it may be desirable to trace back the accurate location of the electronic component on the substrate, to verify the physical parameters of the layers at the manufacturing in the corresponding area of the substrate and to facilitate the failure analysis.

The traceability of the electronic component may be achieved at the time of the assembly, that is, when the component is encapsulated, with a specific mark on the package. However, this operation, often manually performed by an operator, results in significant costs and production time. Further, it is not adapted if the component is not encapsulated in a package, and is poorly adapted to mass production.

Certain assembly lines provide a semi-manual solution, implementing a sampling, the forming of a mapping between the position of the component on the substrate and the package number, as well as a serialization of the package, supervised by the operator. However, all these operations require the intervention of human operators, which may be a source of errors.

Document U.S. Pat. No. 8,187,897 discloses a method of manufacturing an assembly of electronic components on a semiconductor substrate. An individual pattern is attached to one of the layers of the electronic component, which forms a unique identifier of the component enabling to trace the substrate from which it originates as well as its position on the substrate.

However, this approach has the disadvantage of a certain complexity of implementation, particularly in that it requires the application of additional photolithography masks, with respect to a conventional method of manufacturing an assembly of components, these additional masks being required to generate a specific pattern for each component. The addition of photolithography masks further result in an additional cost and production time.

OBJECT OF THE INVENTION

The present invention concerns a solution alternative to those of the state of the art, and aims at overcoming all or part of the previously-mentioned disadvantages. It particularly concerns a method of manufacturing an assembly of electronic components on a semiconductor substrate enabling to locate each electronic component on the substrate after its cutting, without requiring an additional photolithography step during the forming of the assembly of electronic components.

BRIEF DESCRIPTION OF THE INVENTION

The invention concerns a method of manufacturing an assembly of electronic components on a front surface of a semiconductor substrate comprising a plurality of field areas, each field area comprising at least one field and each field comprising at least one electronic component, the method comprising a plurality of photolithography steps to form a stack of layers forming each electronic component, each photolithography step defining a mask level and comprising the application of a mask successively on each field in photolithography equipment, the positioning of said mask on each field being performed relative to a reference mask level, one of the masks being designated as identification mask.

The manufacturing method is remarkable in that:
  at the photolithography step defining a mask level associated with the identification mask, said mask is positioned with a predetermined offset with respect to the reference mask level, the offset being different for each field area,
  the electronic component(s) of a field area exhibit an identification element appearing as a predetermined offset between a pattern defined at the reference mask level and a pattern defined at the identification mask level.

According to other advantageous and non-limiting features of the invention, taken alone or according to any technically feasible combination:
  the predetermined offset varies between a minimum optically-detectable offset and a maximum offset likely to degrade the performance of the electronic components; the predetermine offset comprises a first offset amplitude along a first axis of a main plane parallel to the front surface of the substrate, and/or a second offset amplitude along a second axis of the main plane; the plurality of photolithography steps comprises a photolithography step for an opening of contacts of the electronic components, and the identification mask corresponds to the mask applied at the photolithography step for the opening of contacts; the reference mask level is defined by a photolithography step, prior to that for the opening of contacts, for the forming of a last metallization layer of the stack of layers forming each electronic component; the predetermined offset has amplitudes in the range from 1 µm to 100 µm; each field area comprises a single field; each field comprises a single electronic component; the electronic components comprise high electron mobility transistors based on III-N materials.

The invention also concerns an electronic structure formed of an assembly of electronic components arranged on the front surface of a semiconductor substrate comprising a plurality of field areas, each area comprising at least one field and each field comprising at least one electronic component, each electronic component being formed of a stack of layers, the structure being characterized in that an electronic component of a field area exhibits an identification element appearing as a predetermined offset between:
- a pattern, defined at a reference mask level during a photolithography step of the structure manufacturing method, in a layer of the stack forming said component, and
- a pattern, defined at an identification mask level during a subsequent photolithography step of the structure manufacturing method, in another layer of the stack.

The predetermined offset is different according to the field areas.

BRIEF DESCRIPTION OF THE DRAWINGS

Other features and advantages of the invention will appear from the following detailed description in relation with the appended drawings, in which:

FIG. 1 shows an electronic structure formed of an assembly of electronic components arranged on the front surface of a semiconductor substrate, obtained by a manufacturing method according to the invention;

FIG. 2a shows an alignment of patterns conventionally performed between a mask level $L_n$ and a reference mask level $L_{ref}$;

FIG. 2b shows several possibilities of predetermined offset $D_{ZC}$ between the patterns of an identification mask level $L_i$ and the patterns of a reference mask level $L_{ref}$, said predetermined offset $D_{ZC}$ being applied during a photolithography step of the manufacturing method according to the invention;

FIG. 2c shows an example of implementation of the manufacturing method according to the invention, with predetermined offsets $D_{ZC}$ applied to each field area ZC1, ZC2, ZC3, ZC4, ZC5 of the substrate having the electronic components formed thereon;

FIG. 3a shows an alignment of marks conventionally performed between a mask level $L_n$ and a reference mask level $L_{ref}$;

FIG. 3b shows several possibilities of predetermined offset $D_{ZC}$ between the alignment mark of an identification mask level $L_i$ and the alignment mark of a reference mask level $L_{ref}$, said predetermined offset being performed during a photolithography step of the manufacturing method according to the invention.

The figures are simplified representations which, for readability purposes, are not necessarily to scale. The same reference numerals in the drawings may be used for elements of same nature. The different possibilities (variants and embodiments illustrated and/or detailed in the following description) should be understood as being non-exclusive from one another and may be combined together.

DETAILED DESCRIPTION OF THE INVENTION

The invention relates to an assembly of electronic components. Electronic component designates any component of micrometer-range to millimeter-range size, formed of a stack of layers, capable of using electric currents to transmit, process, or store information. Each electronic component may thus be formed of or comprise for example a resistor, a capacitor, a coil, a transistor, an integrated circuit, any combination or any assembly of these elements, or also other elements or assemblies of elements well known by those skilled in the art. Preferably, but without for this to be limiting for the invention, the electronic components may in particular comprise high electron mobility transistors formed on a substrate based on III-N materials.

More generally, electronic components 3 are formed on a front surface of a semiconductor substrate 1 (FIG. 1). Substrate 1 preferentially appears in the form of a circular wafer, having a diameter in the range from 100 mm to 450 mm and a thickness in the range from 100 to 1,500 micrometers. Semiconductor substrate 1 may comprise any semiconductor material, for example, silicon, and more specifically, as previously mentioned, a stack of binary, ternary, or quaternary III-N materials, such as for example gallium nitride (GaN), aluminum gallium nitride (AlGaN), etc.

Of course, the invention is by no way limited to such shapes, dimensions, or composition of semiconductor substrate 1.

The front surface of semiconductor substrate 1 extends in a main plane (x, y) and the stack of layers forming the electronic components is formed along an axis z normal to this plane (x, y). The forming of this stack requires a succession of steps of manufacturing, namely steps of layer deposition, of lithography to define the structuring of said layer, of etching to structure the layer, of surface treatment, etc.

As reminded in the introductive portion of the present application, during a photolithography step, the application of the photolithography mask corresponding to the step and the exposure to light are performed field 2 by field 2. A field 2 (also called exposure field 2) may comprise a single electronic component 3 or a plurality of electronic components 3, typically between two and several hundreds. For simplification in FIG. 1, components 3 have only been shown on four fields 2, in the case in point nine components 3 per field 2.

As shown in FIG. 1, the front surface of semiconductor substrate 1 comprises a plurality of field areas ZC (the example of FIG. 1 schematically shows five field areas ZC1, ZC2, ZC3, ZC4, ZC5). Each field area ZC comprises one field 2 or a plurality of fields 2.

Generally, the number and the distribution of the fields 2 in each field area ZC may be identical for all areas 4, or different from one area to the other.

As will be subsequently described, the invention provides the possibility of gathering a plurality of fields 2 into field areas ZC, so that the fields 2 of a same area ZC have similar characteristics, while the fields 2 of different areas ZC have recognizable different characteristics.

In the simplified example of FIG. 1, first area ZC1 comprises a single field, positioned at the center of semiconductor substrate 1. Second area ZC2 comprises eight fields, third area ZC3 comprises sixteen fields, fourth area ZC4 comprises twenty-four fields, and fifth area ZC5 comprises twenty fields. For simplification, the components 3 per field 2 have only been shown on two fields of second area ZC2 and on one field of the third ZC3 and fourth ZC4 field areas.

The shape and the size of field areas ZC may be freely chosen, within the limit of the fact that they are formed of one or a plurality of fields 2. Preferably, when semiconductor substrate 1 is circular, areas ZC may be selected to be concentric, as in the example of FIG. 1. As a variant, each area ZC may extend over one quarter of semiconductor substrate 1, for example, half or one quarter of said substrate. Generally, areas ZC may extend over all portions of substrate 1 comprising one or a plurality of contiguous or non-contiguous fields.

Returning to the manufacturing method according to the invention, such a method comprises a plurality of photolithography steps to form a stack of layers forming each electronic component 3. These steps, specifically defined to form said stack of layers, are manufacturing photolithographic steps. These photolithography steps are separated by other well known steps enabling to form the stack, such as thermal treatment, deposition, etching, cleaning, doping, or polishing steps. The different steps of forming of a stack forming an electronic component are quite conventional and known by those skilled in the art and will be only briefly discussed.

The thermal treatment steps are typically carried out at temperatures in the range from 200° C. to 1,200° C., particularly to form silicon nitride or oxide layers, to degas layers, or to perform a rearrangement of the crystal lattices.

The deposition steps may be performed by various known physical or chemical techniques, such as vapor deposition, sputtering, or epitaxy, for example, according to the desired type of layers and to the compatibility, particularly in terms of temperature, of the stack. The deposited layers may be of various natures: semiconductor, insulating, or conductive.

The etch steps may be carried out in baths of chemical solutions (wet etching) or in plasma or reactive ion etching (dry etching) equipment. The cleaning steps are usually performed in chemical baths.

Steps of surface treatment, such as chemical-mechanical polishing, may also be applied to the stack of layers to planarize certain layers or remove local overthicknesses.

During each photolithography step, semiconductor substrate 1 is arranged in photolithography equipment (not shown). After a resist layer has been deposited, generally over the front surface of substrate 1, each photolithography step comprises the application of a mask successively on each field 2. When it is applied to a field 2, the latter is exposed to a light source of low wavelength, generally ultraviolet or X-ray, to project the image of the mask into the resist layer, thus defining patterns in the resist layer.

Etch steps then enable to duplicate the pattern of the resist layer in the layer of the stack located underneath and thus to structure the latter. The patterns may for example be formed of an arrangement of fingers interdigited to form gate, source, and drain electrodes of a transistor, or of a network of openings to form electrically-conductive interconnection vias, or also a plurality of contact pads intended to connect each component 3. In all cases, the patterns are functional, that is, their shape and their layout are defined to make electronic component 3 functional.

As an example, when electronic component 3 comprises a transistor, the stack of layers comprises an active semiconductor layer, having a plurality of interconnection layers typically formed of an alternation of uniform or structured, insulating or metallic, layers and eventually of an upper passivation layer, stacked thereon.

It is usual to speak of a mask level to qualify the patterns defined by a photolithography step in a layer n of the stack. The first mask levels ($L_1$, $L_2$, $L_3$, . . . ), which aim at structuring the active layer of semiconductor substrate 1, are associated with masks ($m_1$, $m_2$, $m_3$, . . . ) forming patterns of very small dimensions (typically in the order of some ten or some hundred nanometers) and requiring a high resolution at the photolithography step. In addition to the accuracy of definition of the patterns on the actual mask, this high resolution includes the fact of positioning (in the main plane (x,y)) the mask $m_n$ of mask level $L_n$ very accurately with respect to the previous mask level $L_{n-1}$. A photolithography step thus generally requires an accurate alignment between the successive mask levels $L_n$. This alignment is performed by means of crosses and/or alignment marks respectively present on masks $m_n$ and printed in the layers at the different mask levels $L_{n-1}$, which enable to position mask m n on a field 2 with respect to a previous mask level (corresponding to a lower level in the stack of layers).

In practice, the positioning (in the main plane (x,y)) of the successive masks is performed with respect to a reference mask level $L_{ref}$, which may be the first mask level implemented in the stack of layers or, more generally, a previous mask level.

The higher the masks levels $L_n$ (typically, to structure the metal interconnection layers or open the contacts of the electronic components), the more masks $m_n$ form patterns of large dimensions: for example, for the last metallization stage of the stack of layers of an electronic component of field-effect transistor type, the patterns may measure in the order of from a few tens to a few hundreds of micrometers.

In the manufacturing method according to the invention, a mask $m_n$ used during one of the manufacturing photolithography steps is designated as "identification mask" $m_i$ in the present description. The mask level $L_i$ associated with identification mask $m_i$ is called identification mask level $L_i$ hereafter.

Thus, according to the invention, at the photolithography step defining the mask level $L_i$ associated with identification mask $m_i$, said mask $m_i$ is positioned, in the main plane (x,y), with a predetermined offset $D_{zc}$ with respect to reference mask level $L_{ref}$ and offset $D_{zc}$ is different for each field area ZC.

The electronic component(s) 3 of a field area ZC then has (have) an identification element appearing as a predetermined offset $D_{zc}$, in the main plane (x,y), between a pattern defined at reference mask level $L_{ref}$ and a pattern defined at identification mask level $L_i$.

Thereby, after the cutting of electronic components 3, it is possible to recognize the field area ZC of substrate 1 from which each component 3 originates by measuring the predetermined offset $D_{ZC}$ between a pattern defined at reference mask level $L_{ref}$ and a pattern defined at identification mask level $L_i$. The manufacturing method according to the invention thus enables, without carrying out an additional photolithography step (i.e., by only performing the manufacturing photolithography steps) and particularly with no additional mask to be applied, to identify the location of components 3 per area ZC of semiconductor substrate 1, by the controlled variation of the offset between identification mask level $L_i$ and reference mask level $L_{ref}$, from one field area ZC to another.

In the example shown in FIG. 1, the components in the fields 2 of second field area ZC2 will exhibit an identical identification element, corresponding to a predetermined offset $D_{ZC2}$, but different from the identification elements of components 3 in the fields 2 of the other field areas ZC1, ZC3, ZC4, ZC5, themselves different from one another.

Advantageously, to be able to locate and to reliably characterize the identification element, for each field area ZC, the predetermined offset $D_{zc}$ varies between a minimum optically-detectable offset and a maximum offset likely to degrade the performance of electronic components 3. Indeed, if the offset between identification mask level $L_i$ and reference mask level $L_{ref}$ is too large, the functional patterns present in identification mask level $L_i$ will no longer be correctly arranged in the stack of layers to provide the electronic components with the desired electric characteristics. Of course, the maximum offset will depend on the mask level $L_n$ selected to form identification mask level $L_i$.

Examples of minimum and maximum offsets are given hereafter, in reference with different choices of identification mask level $L_i$.

According to an advantageous embodiment, to avoid intervening on the most sensitive and functional layers in the stack, associated with the first mask levels, identification mask $m_i$ corresponds to the mask applied at the photolithography step for the opening of contacts of electronic components 3. This is typically the last photolithography step (last mask level) which is carried out on the stack of layers of substrate 1. It comprises defining openings in the upper passivation layer of the stack, opposite the electric contact pads of each component 3, to give access to an electric connection from component 3 to the outside.

In this embodiment, reference mask level $L_{ref}$ is preferably defined by a photolithography step, prior than that for the opening of contacts, performed for the forming of a last metallization layer of the stack of layers: the mask level defined by this step is usually called "last metal level".

FIG. 2a illustrates a standard alignment, usually performed between a mask level $L_n$ and reference masking level $L_{ref}$. The pattern of upper mask level $L_n$ is centered on the pattern of the lower mask level $L_{n-1}$ ($L_{ref}$ in this specific case). In the previously-mentioned advantageous embodiment, lower mask level $L_{n-1}$ is the last metal level: the associated patterns correspond to the contact metal pads. Upper mask level $L_n$ is the contact opening level: the associated patterns correspond to the window to be opened to provide access to the underlying metal contact pads.

FIG. 2b shows a plurality of possible predetermined offsets $D_{ZC}$, implemented during the application of the identification mask $m_i$ corresponding to the contact opening mask level ($L_i$ in the drawing). The predetermined offsets $D_{zc}$ are characterized:—by a first offset amplitude $A_x$ along a first x axis in the main plane (x, y) parallel to the front surface of substrate 1 (FIG. 2b (i)), or by second offset amplitude $A_y$ along a second axis y in the main plane (x, y) parallel to the front surface of substrate 1 (FIG. 2b (ii)), or also by a first offset amplitude $A_x$ and a second offset amplitude $A_y$, respectively along the first x axis and the second y axis in the main plane (x, y) (FIG. 2b (iii)).

Offset amplitudes $A_x$, $A_y$ represent the deviations with respect to a standard alignment of identification mask $m_i$ on reference mask level $L_{ref}$ in the processed field 2. The standard alignment corresponds to spacings X and Y, between the patterns of two mask levels, respectively, along the x and y axes, as illustrated in FIG. 2a. It is of course required to apply measurable and recognizable offset amplitudes: the latter should thus be greater than the alignment and centering uncertainties usually encountered between the considered mask levels.

It should be noted that these offset amplitudes $A_x$, $A_y$ are predefined for each field area ZC and stored in the photolithography equipment, which will automatically implement them on application of identification mask $m_i$ (mask level $L_i$) on each field 2, according to the field area ZC to which it belongs.

In the described advantageous embodiment, the lateral dimensions of the contacts of components 3 at the last metal level (reference mask level $L_{ref}$) are typically in the range from 50 to 5,000 micrometers; the lateral dimensions of the opening window in the upper passivation layer, which should be defined at the contact opening mask level (identification mask level $L_i$), are typically in the order of from 30 to 3,000 micrometers. Thus, it is possible to apply predetermined offsets $D_{zc}$ for which the first $A_x$ and/or the second $A_y$ offset amplitude is (are) for example in the range from 1 micrometer to 100 micrometers, between the patterns of reference mask level $L_{ref}$ and the patterns of identification mask level $L_i$ as illustrated in FIG. 2b.

Referring to the previously-mentioned embodiment, an example of implementation is shown in FIG. 2c. Field areas ZC are those defined in FIG. 1 and the predetermined offsets $D_{zc}$, associated with each field area ZC, are the following:

$D_{zc1}$: $A_x$=0, $A_y$=0;
$D_{zc2}$: Ax=+10 micrometers, Ay=+10 micrometers;
$D_{zc3}$: Ax=−10 micrometers, Ay=−10 micrometers;
$D_{zc4}$: Ax=−10 micrometers, Ay=+10 micrometers;
$D_{zc5}$: Ax=+10 micrometers, Ay=−10 micrometers;

The value of 10 micrometers for the first $A_x$ and second $A_y$ offset amplitudes is here arbitrarily provided: these amplitudes might take different values in the range from 1 to 100 micrometers. Negative values indicate an offset, with respect to the standard alignment, in the reverse direction of the considered x or y axis.

After the singulation of the electronic components in the form of individual chips, it will be possible to trace back for each component its original field area ZC on substrate 1, only by observation and measurement of the predetermined offset $D_{zc}$ between the patterns of the last metal level (reference mask level $L_{ref}$) and the patterns of the contact opening level (identification mask level $L_i$). This offset forms an identification element which adds no complexity to the method of manufacturing the assembly of components 3 on substrate 1.

According to another example of implementation, field areas ZC comprise a single field 2. Given the larger number of field areas ZC, the predetermined offsets $D_{zc}$ associated with each area ZC are more accurately defined than in the previous case with five field areas ZC. One may for example choose to vary amplitudes $A_x$ and $A_y$ in increasing fashion as the distance to the central field increases.

After the singulation of electronic components 3 in the form of individual chips, it will be possible to trace back for each component, its original field area ZC on substrate 1, only by observation and measurement of the predetermined offset $D_{zc}$ between the patterns of the last metal level (reference mask level $L_{ref}$) and the patterns of the contact opening level (identification mask level $L_i$). This example of implementation provides additional accuracy regarding the original location of components 3 since each field area ZC comprises a single field. In the case where each field 2 comprises a single component 3, it is thus possible to trace back the original location of each component due to the identification element.

According to a variant, the predetermined offset $D_{zc}$ may be defined between alignment marks or crosses and not directly between functional patterns of the considered mask levels. As illustrated in FIG. 3a, the pattern of upper mask level $L_n$ is centered on the pattern of lower mask level $L_{n-1}$, due to the centering of the cross in the square, the latter forming the respective alignment marks of the two mask levels. The predetermined offsets $D_{zc}$ may be applied to the alignment marks (FIG. 3b i) and ii)).

The identification element is then present at the level of the upper passivation layer of the stack, and has the advantage of being visible in the context of a visual examination. An observation with an optical microscope of the singulated component may thus enable to trace back the original location thereof on semiconductor substrate 1. Of course, other optical methods than the simple observation with an optical microscope may be used to analyze the identification elements, such as an optical analysis by means of pattern recognition software, for example.

According to other embodiments, the identification mask(s) correspond to the mask(s) applied at the photolithography step for any mask level. The predetermined offset $D_{zc}$ is then adapted to the patterns of the identification $L_i$ and reference $L_{ref}$ mask levels.

The present invention also concerns an electronic structure formed of an assembly of electronic components 3 arranged on the front surface of a semiconductor substrate 1, and capable of being formed based on the previously described manufacturing method.

Semiconductor substrate 1 comprises a plurality of field areas ZC. Each area ZC comprises at least one field 2 and each field 2 comprises at least one electronic component 3. Each electronic component 3 is formed of a stack of layers. Each component 3 further comprises an identification element appearing as a predetermined offset $D_{zc}$ between:
  a pattern, defined at a reference mask level $L_{ref}$ during a photolithography step of the structure manufacturing method, in a layer of the stack forming said component 3, and
  a pattern, defined at an identification mask level $L_i$ during a subsequent photolithography step of the structure manufacturing method, in another layer of the stack.

The predetermined offset is different according to the field areas ZC: a specific offset is thus representative of a field area ZC of the electronic structure.

The identification element is thus recognizable and different for each field ZC, which enables, once the cutting of the electronic structure around each electronic component 3 has been performed, to be able to identify if need be the field area ZC of substrate 1 from which electronic component 3 originates.

Of course, the invention is not limited to the described embodiments and alternative embodiments may be brought thereto without departing from the framework of the invention such as defined by the claims.

The invention claimed is:

1. A method, comprising:
  manufacturing an assembly of electronic components on a front surface of a semiconductor substrate that includes a plurality of field areas, each field area including at least one field and each field including at least one electronic component, the manufacturing including:
    performing a first photolithography step for an opening of contacts of electronic components;
    performing a second plurality of photolithography steps forming a stack of layers forming each electronic component, each second photolithography step defining a mask level and applying a mask successively on each field in photolithography equipment, a positioning of the mask on each field being performed relative to a reference mask level, one of the masks being an identification mask, the performing including:
    applying the mask that corresponds to the identification mask at the first photolithography step for the opening of contacts;
    at the first photolithography step for the opening of contacts, defining a mask level that corresponds to the identification mask, positioning the identification mask with a predetermined offset with respect to the reference mask level, the offset being different for each field area, the electronic component(s) of a field area exhibit an identification element appearing as the predetermined offset between a pattern defined at the reference mask level and a pattern defined at the identification mask level.

2. The manufacturing method according to claim 1, wherein the predetermined offset varies between a minimum optically-detectable offset and a maximum offset that degrades the performance of the electronic components.

3. The manufacturing method according to claim 2, wherein the predetermined offset comprises a first offset amplitude along a first axis of a main plane parallel to the front surface of the substrate, and a second offset amplitude along a second axis of the main plane.

4. The manufacturing method according to claim 1, wherein the reference mask level is defined by a third photolithography step, prior to the first photolithography step for the opening of contacts, for the forming of a last metallization layer of the stack of layers forming each electronic component.

5. The manufacturing method according to claim 1, wherein the predetermined offset has a first offset amplitude and a second offset amplitude, in the range from 1 µm to 100 µm.

6. The manufacturing method according to claim 1, wherein each field area comprises a single field.

7. The manufacturing method according to claim 1, wherein each field comprises a single electronic component.

8. The manufacturing method according to claim 1, wherein the electronic components comprise high electron mobility transistors based on III-N materials.

9. A method, comprising:
  forming plurality of electronic components on a semiconductor substrate, each component including an identification element that enables, after singulation of the components, to identify back a location of the components on the substrate, the substrate includes a first area having a first field, a second area having a plurality of second fields, and a third area having a plurality of third fields, the forming the plurality of electric components including:

forming a stack of layers with a plurality of photolithography steps in photolithography equipment;

for each first photolithography step, applying a mask successively on each of the first field, the plurality of second fields, and the plurality of third fields; and forming an identification mask with a plurality of offsets with respect to a reference mask, each offset being different for each of the first, second, and third fields, wherein:

each identification element comprises a first pattern and a second pattern such that the first pattern and the second pattern are situated at different layers of the multilayer structure, the first pattern is covered by the second pattern, and a predetermined offset exists between the first pattern and the second pattern; and an area of the first pattern is entirely contained within an area of the second pattern, as viewed from above the main plane.

10. The method of claim 9, wherein forming the identification mask includes forming a second photolithography step that is after the first photolithography steps.

11. The method of claim 10, wherein forming the identification mask includes forming a plurality of contact openings with each of the plurality of electronic components.

12. The method of claim 11, wherein each offset is in the range of 1 micrometer and 100 micrometers.

13. The method of claim 9, wherein the first field, each of the plurality of second fields, and each of the plurality of third fields are each a single electronic component.

14. The method of claim 13, wherein each of the plurality of the second fields is a first type of electronic component and the first field is a second type of electronic component.

15. The method of claim 14, wherein the plurality of third fields comprise a third type of electronic component.

16. The method of claim 9, wherein the layer with the first pattern is a contact opening layer.

17. An electronic component, comprising:
a substrate;
a multilayer structure on the substrate; and
an identification element comprising a first pattern and a second pattern, the first pattern and the second pattern at different layers of the multilayer structure, the first pattern covered by the second pattern, a predetermined offset between the first pattern and the second pattern, the predetermined offset comprises a first offset amplitude along a first axis of a main plane parallel to the front surface of the substrate, and a second offset amplitude along a second axis of the main plane,
wherein an area of the first pattern is entirely contained within an area of the second pattern, as viewed from above the main plane.

18. The electronic component according to claim 17, wherein the first offset amplitude and the second offset amplitude are in the range from 1 μm to 100 μm, inclusive.

19. The electronic component according to claim 17, wherein the predetermined offset varies between a minimum optically-detectable offset and a maximum offset that degrades the performance of the electronic component.

20. The electronic component according to claim 17, wherein the layer with the first pattern is a contact opening layer, and the layer with the second pattern is a metal layer.

21. The electronic component according to claim 17, wherein the layer with the first pattern is a contact opening layer.

* * * * *